United States Patent [19]

Sugiyama et al.

[11] 4,207,556
[45] Jun. 10, 1980

[54] PROGRAMMABLE LOGIC ARRAY ARRANGEMENT

[75] Inventors: Yoshi Sugiyama, Tokorozawa; Keisuke Kataoka, Higashiyamato, both of Japan

[73] Assignee: Nippon Telegraph and Telephone Public Corporation, Tokyo, Japan

[21] Appl. No.: 857,306

[22] Filed: Dec. 5, 1977

[30] Foreign Application Priority Data

Dec. 14, 1976 [JP] Japan .................................. 51-149441
Mar. 30, 1977 [JP] Japan .................................. 52-34726

[51] Int. Cl.² ........................................... H03K 19/08
[52] U.S. Cl. ................................. 340/166 R; 307/207; 364/716; 365/96
[58] Field of Search ...................... 340/166 R, 147 P; 365/94, 96, 230; 364/716; 307/207, 303, DIG. 5

[56] References Cited

U.S. PATENT DOCUMENTS

| | | | |
|---|---|---|---|
| 3,760,200 | 9/1973 | Taniguchi et al. | 307/303 |
| 3,909,636 | 9/1975 | Masaki et al. | 307/207 X |
| 3,974,366 | 8/1976 | Hebenstreit | 364/716 |
| 3,983,538 | 9/1976 | Jones | 364/716 |

Primary Examiner—John W. Caldwell, Sr.
Assistant Examiner—Daniel Myer
Attorney, Agent, or Firm—Charles E. Pfund

[57] ABSTRACT

The programmable logic array arrangement comprises a plurality of cell units formed on a semiconductor substrate and wiring means for interconnecting the cell units. Each cell unit comprises a plurality of electronic elements such as resistors, transistors and diodes which are necessary to form logic circuits, and the wiring means comprises a plurality of bit lines and product term lines which are arranged in the form of a matrix, conductive layers for determining the type and input-/output conditions of the logic circuit to be formed. The array arrangement further comprises a group of switching elements connected between the electronic element, bit lines, product term lines, and conductive layers for interconnecting or disconnecting these elements thereby forming desired logic circuits.

14 Claims, 32 Drawing Figures

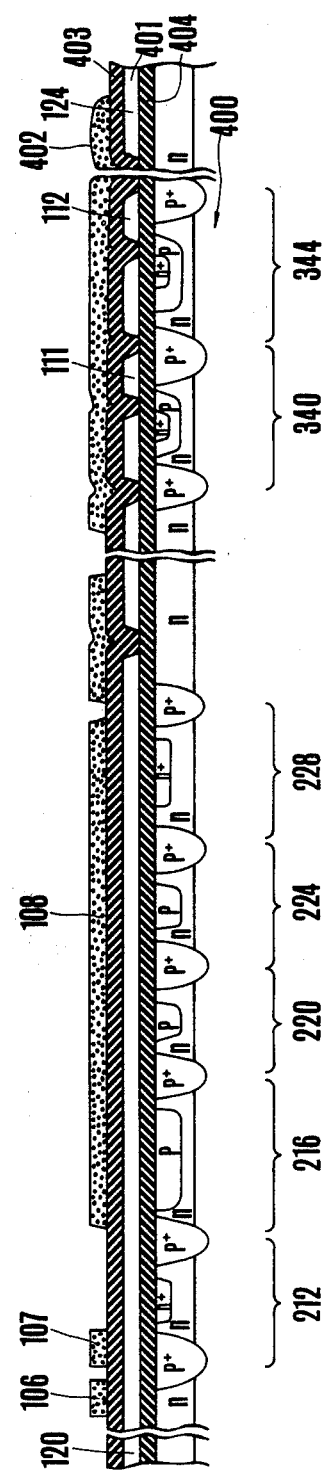
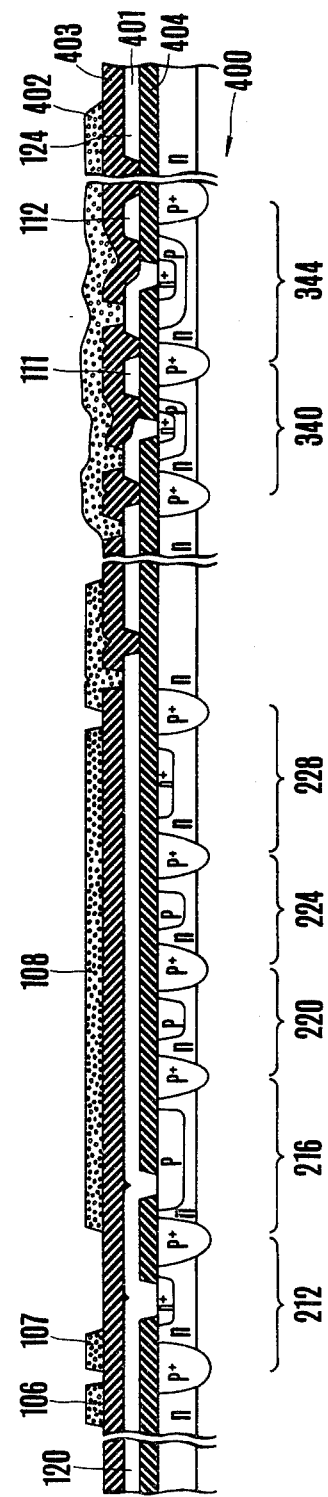

F I G.11A
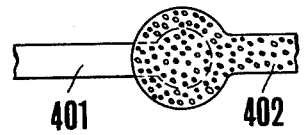
F I G.12A
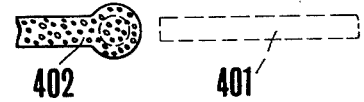
F I G.11B
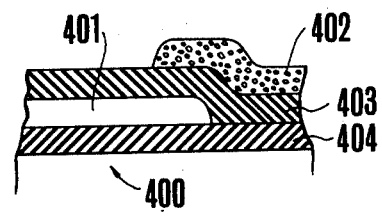
F I G.12B
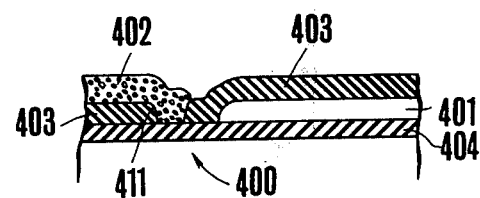
F I G.11C
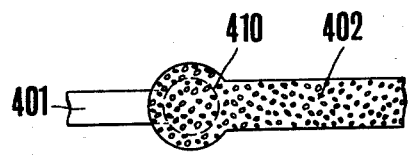
F I G.12C
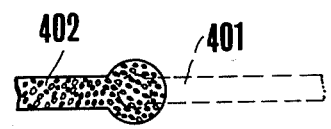
F I G.11D
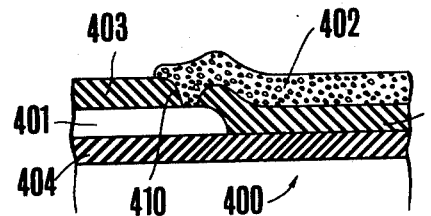
F I G.12D
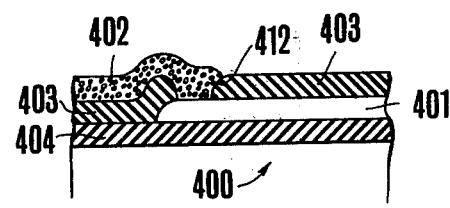

FIG.15A
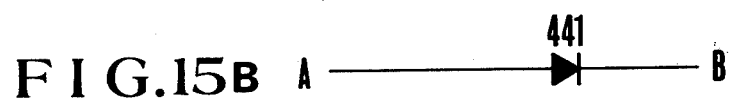
FIG.15B
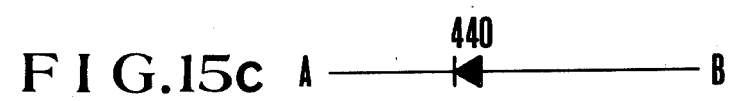
FIG.15C
FIG.16
FIG.17A
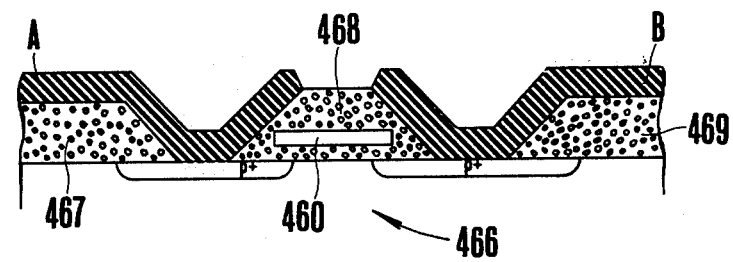
FIG.17B
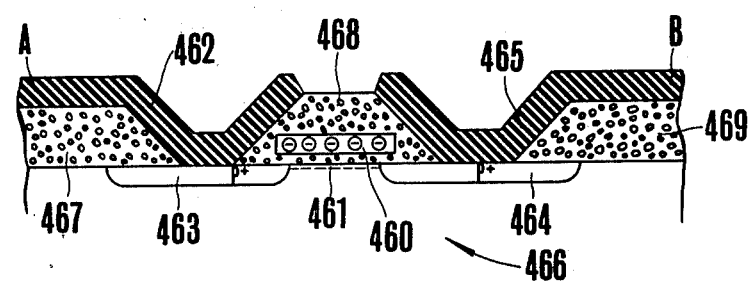

4,207,556

PROGRAMMABLE LOGIC ARRAY ARRANGEMENT

BACKGROUND OF THE INVENTION

This invention relates to a programmable logic array arrangement, more particularly to a programmable logic array arrangement suitable for large scale logic integrated circuits (LSI).

Among prior art techniques of this type are included a master slice type LSI and a programmable logic array (PLA). According to the former technique it is possible to design and manufacture at low costs LSIs having various logic function by fabricating the LSIs with the same process steps up to the diffusion step and with various wiring masks. However, when this method is applied to the manufacture of larger scale logic integrated circuits, the design of the wiring masks becomes more troublesome so that this method is not economical.

For this reason, the latter method has been developed. According to this method, the layout of the electronic circuit elements and wirings required to construct such special logic circuits as a decoder, an AND array, an OR array, output buffer and the like is predetermined, and all logics are realized by individually designing only one mask to program cross points of an AND array and of an OR array for fabricating all types of logic LSIs according to a desired logic circuit. This method is described, for example, in an article of the title "Programmable Logic Arrays" of Dr. William N. Carr et al "MOS/LSI Design and Application" published by Mcgrow Hill Book Co., 1972, pages 229-257, chapter 8. This method, however, is defective in that the use of the chip area is redundant so that even if the manufacture of fine structure LSIs becomes possible by the development of the technique of manufacturing LSIs it would be impossible to realize high density and high efficiency logic LSIs but rather would result in the increase of redundancy.

Describing this defect in more detail, when designing logic circuits for various purposes, it has been impossible to fabricate desired logic circuits on the ground that, although AND arrays are formed abundantly, OR arrays are deficient or that OR arrays are surplus, but AND arrays are deficient. Furthermore, when constructing sequential circuits, it is necessary to separate the PLA output for applying it to the input of an external flip-flop circuit and to feedback the output of the flip-flop circuit to the PLA. To this end, it is necessary to provide an additional flip-flop circuit. When this flip-flop circuit is incorporated into the PLA, its efficiency of utilization would be degraded.

SUMMARY OF THE INVENTION

Accordingly, it is the principal object of this invention to provide an improved programmable logic array arrangement capable of greatly improving the logical capabilities than those of the prior art programmable logic array arrangement.

Another object of this invention is to provide a novel programmable logic array arrangement capable of decreasing the number of the mask patterns or exposure patterns which are designed independently to only few patterns, yet capable of greatly improving the logical capabilities while fully utilizing the characteristics of the PLA system.

Still another object of this invention is to provide a novel programmable logic array arrangement capable of readily designing and manufacturing larger scale logic integrated circuits.

A further object of this invention is to provide an improved programmable logic array arrangement capable of increasing the freedom of designing of the logic circuits.

According to one embodiment of this invention, there is provided a programmable logic array arrangement comprising a plurality of cell units formed on a semiconductor substrate, each comprising a plurality of electronic elements such as resistors and transistors which are necessary to constitute a logic circuits, a plurality of row lines and column lines which are arranged in the form of a matrix, a first wiring member adapted to determine the type of a logic circuit to be formed, a second wiring member to determine the input/output conditions of the logic circuit, and a group of switching elements arranged between the cell units, the row and column lines and the first and second wiring members for interconnecting and/or disconnecting the same.

According to another embodiment of this invention, there is provided a programmable logic array arrangement comprising a plurality of cell units formed on a semiconductor substrate and wiring means for interconnecting the cell units, each one of the cell units including a function unit and an array unit each constituted by a plurality of electronic elements such as resistors and transistors which are necessary to form logic circuits, the wiring means including a wiring structure constituted by at least two conductive layers between which switching elements are formed for interconnecting and/or interrupting the electronic elements, and the wiring structure provided for the array unit including a plurality of row lines and a plurality of column lines which are arranged in a matrix.

BRIEF DESCRIPTION OF THE DRAWINGS

The organization and operation of the programmable logic array arrangement together with other objects and advantages of this invention can be more fully understood from the following detailed description taken in conjunction with the accompanying drawings in which:

FIG. 6 is a sectional view taken along a line VIa–VIb ... VII and showing the PLA shown in FIG. 5 before forming a contact hole and a through hole;

FIG. 8 is a sectional view taken along the same line as in FIG. 6 and showing a combination shown in FIG. 7 utilizing the PLA shown in FIG. 5;

FIGS. 11A–11D, FIGS. 12A–12D, FIGS. 13A–13D, FIGS. 14A–14D FIGS. 15A–15C, FIG. 16 and FIGS. 17A and 17B are sectional views and connection diagrams showing some examples of switching elements utilized in this invention.

DESCRIPTION OF THE PREFERRED EMBODIMENTS

Figure 1:
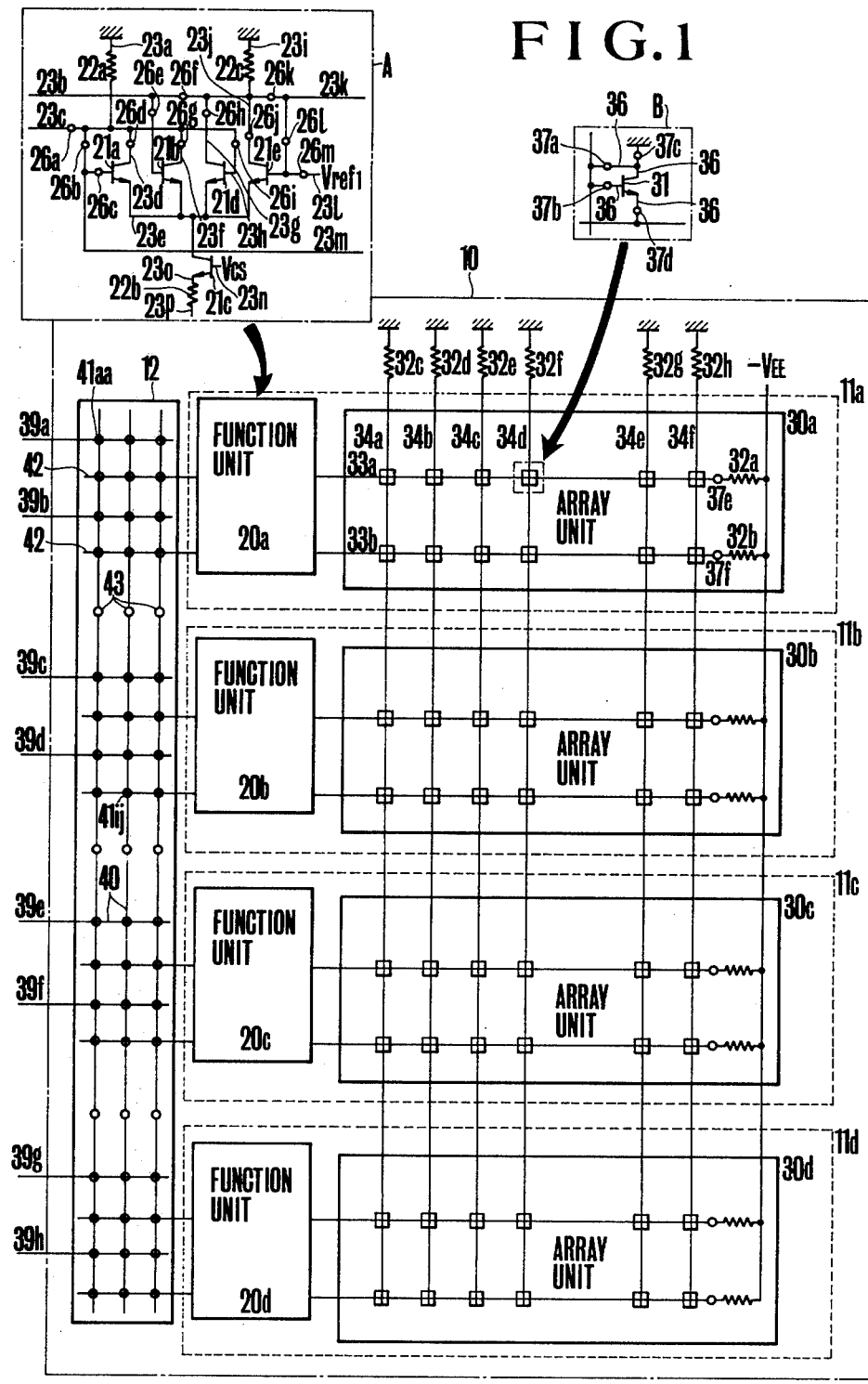
FIG. 1 is a connection diagram, partly in block form, showing the basic construction of the programmable logic array arrangement embodying the invention.

As shown in FIG. 1 which shows the basic construction of the programmable logic array arrangement of this invention, four cell units 11a through 11d and wirings 12 for interconnecting the cell units are arranged on a semiconductor substrate 10, each cell unit comprising a function unit 20 and an array unit 30. The detail of one of the function units is shown at A. As shown, the function unit 20 comprises a plurality of suitably arranged electronic elements such as transistors 21a through 21e and resistors 22a through 22c, wirings interconnecting these electronic circuit elements, and a group of switches 26a, 26b . . . 26m connected between transistors 21a through 21e, resistors 22a through 22c and wirings 23a through 23h for connecting and disconnecting them. Further more, each function unit is provided with electronic elements and connections which are necessary to form a flip-flop circuit, a decoder and output buffer circuits. A switch 26i (i represents any one of a through m) is constructed to form a first metal layer through a contact hole when a LSI is fabricated. The actual construction of the switch will be described later. Switch 26i is shown as a small circle showing that this switch is open.

The details of the array unit 30 is shown at B. Like the function unit 20 each array unit comprises electronic elements such as a transistor 31 and resistors 32a and 32b. Furthermore each array unit includes bit lines (row lines) 33a and 33b, product term lines (column lines) 34a through 34f which are arranged in the form of a matrix and wirings 36 adapted to determine the type of the logic circuit to be formed and the input and output conditions thereof. A group of switches 37a through 37f are connected between the electronic elements, bit lines, product term lines and wirings described above for constructing an AND array and an OR array when the switches are opened or closed. Each of the switches 37a through 37f has a construction similar to that of the switch 26i of the function unit 20, the detail of the construction will be described hereinafter.

The wirings between respective cell units comprise connecting lines 40 for interconnecting the cell units 11a through 11d and input/output terminals 39a through 39h, a group of switches 41aa 41ij (where i and j are positive integers) and a group of switches 43. Switch 41ij is used to connect and/or disconnect a column line and a row line whereas switches 43 are used to connect and/or disconnect sectionalized vertical wirings.

To construct a desired circuit by utilizing the arrangement shown in FIG. 1 switches 26i, 37a through 37f, and switches 41aa through 41ij of the function unit 20, and the array unit 30 of a cell unit and of the wirings 12 between respective cell units are selectively closed.

Figure 2:
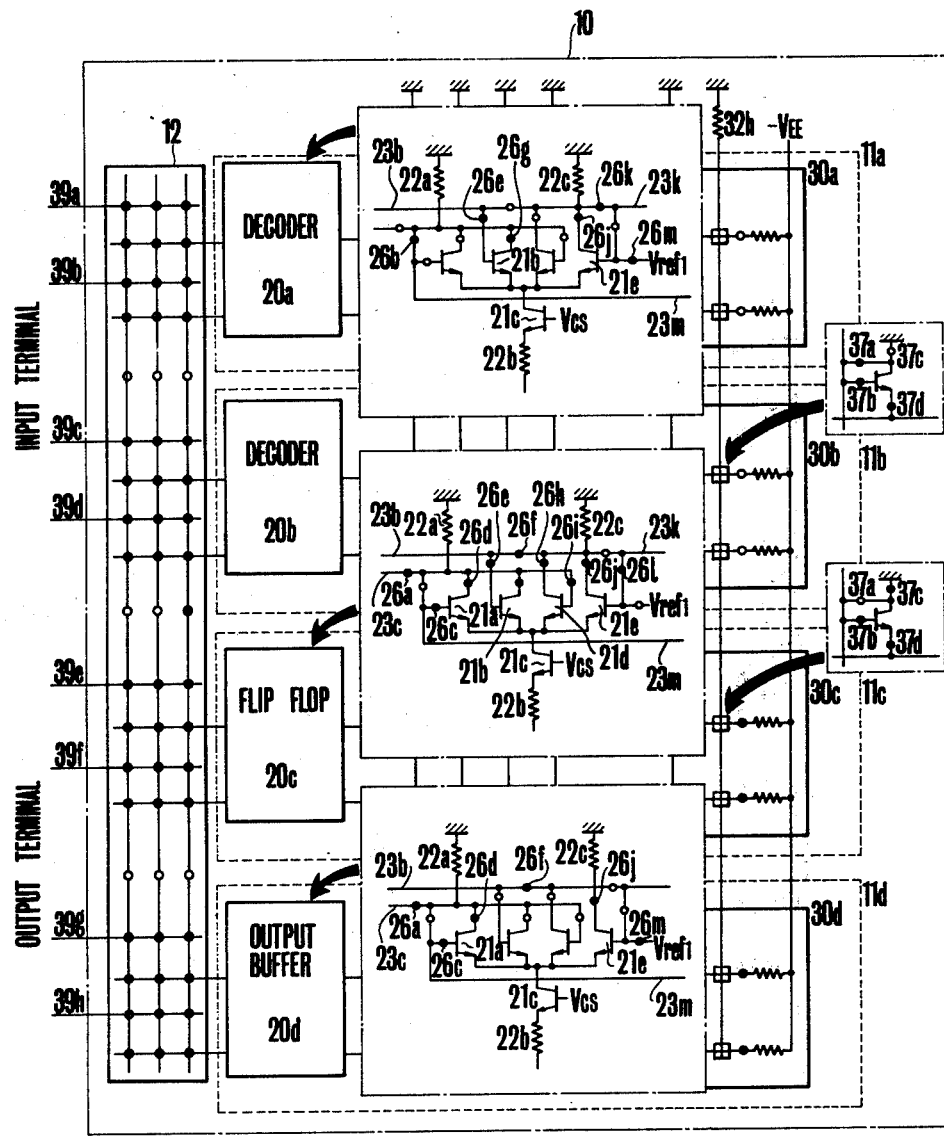
FIG. 2 is a connection diagram showing a logic circuit fabricated by using the programmable logic array arrangement shown in FIG. 1.

FIG. 2 shows a connection diagram in which the function units 20a and 20b of the cell units 11a and 11b are connected to form a decoder; the array units 30a and 30b are connected to form an AND array; the function unit 20c of the cell unit 11c is connected to form a flip-flop circuit; the array unit 30c of the cell unit 11c is connected to form an OR array; the function unit 20d of the cell unit 11d is connected to form an output buffer whereas the array unit 30d of the cell unit 11d is connected to form an OR array. In FIG. 2, small black circles indicate that switches at these portions are closed.

More particularly, to construct a decoder, transistors 21b, 21c and 21e and resistors 22a, 22b and 22c of the function units 20a and 20b of the cell units 11a and 11b are used and switches 26b, 26e, 26g, 26j, 26k and 26m are closed. When a signal applied to input line 23b is at a high level, transistor 21b is turned ON whereas transistor 21e is turned OFF so that a high level signal and a low level signal appear on lines 23k and 23m respectively. On the other hand, where the input signal is at a low level, a low level signal and a high level signal appear on lines 23k and 23m respectively. In other words, the same signal as the input signal appears on line 23k whereas a negation signal on line 23m.

To construct a flip-flop circuit, transistors 21a through 21e and resistors 22a through 22c of the function unit 20c of the cell unit 11c are used, and a signal is applied to lines 23k and 23m from the OR array 30c. When signals appearing on lines 23k and 23m are at high levels respectively, both transistors 21a and 21e become ON so that negation signals appear on lines 23b and 23c. On the other hand, when the signals appearing on lines 23k and 23m are at high and low levels respectively, transistors 21b and 21d are rendered OFF and ON respectively whereby signals applied to lines 23b and 23c are at low and high levels respectively. Where the signals appearing on lines 23k and 23m are at low and high levels respectively, transistors 21b and 21d are turned OFF so that signals at high and low levels appear on lines 23b and 23c respectively.

When the signals applied to lines 23k and 23m are at a low level, transistors 21b and 21d are maintained in the states previously established so that the same outputs as before appear on lines 23b and 23c.

To form an output buffer circuit, transistors 21a, 21c and 21e and resistors 22a, 22b and 22c of the function unit 20d of the cell unit 11d are used, and switches 26a, 26c, 26d, 26f, 26j and 26m are closed. When the OR array 30d produces an OR output transistor 21a is turned ON to obtain the negation output of the OR array on line 23c whereas an affirmation output of the OR array on line 23b.

To form an AND array, switches 37a and 37b of the array units 30a and 30b of the cell units 11a and 11b are closed and switch 37d is selectively closed. Under these conditions a high level output is produced on a product term line when all inputs to bit lines which constitute the AND circuit become a high level.

To form an OR array, switches 37b and 37c of the array units 30c and 30d of the cell units 11c and 11d are closed whereas switch 37d is selectively closed. Under these conditions, when any one of the product term line constituting the OR circuit becomes high level a low level output is produced on a corresponding bit line.

Cell units 11a through 11d cooperate to form a PLA. The input signal applied to input terminal 39a is applied to decoder 20a via interconnecting lines. One of the two outputs of the flip-flop circuit is produced on output terminal 39f and the other output is applied to decoder 20b. The outputs of the output buffer appear on its output terminals 39g and 39h.

Figure 3:
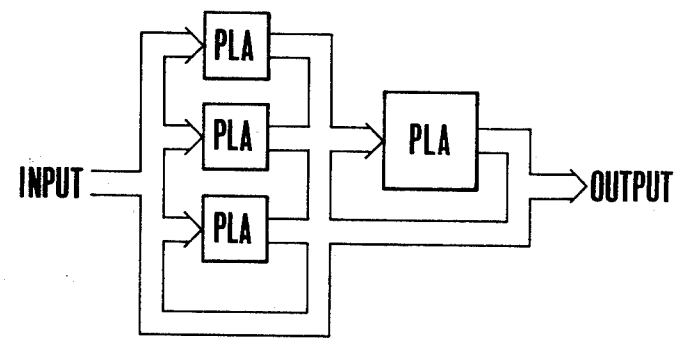
FIGS. 3 and 4 are block diagrams showing systems in which PLAs of this invention are utilized to improve logic capabilities.
Figure 4:
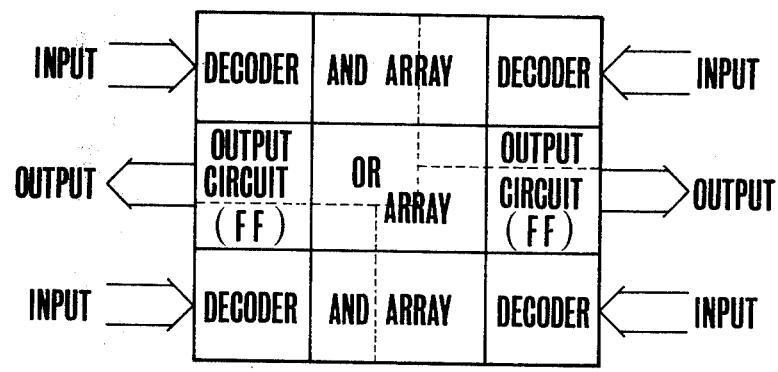

The PLA shown in FIG. 2 comprises a single stage. Generally, however, it is possible to reduce the size of the semiconductor substrate that is the chip size by dividing the PLA into a number of smaller logic function circuits for constructing a multistage PLA as shown in FIG. 3, for example, rather than forming a large logic circuit with a single stage PLA. In some cases, it is possible to reduce the chip size to less than 1/10. Alghough the logic circuit shown in FIG. 3 comprises two stages, of course it is possible to increase the number of stages as desired. When it is possible to arbitrary sectionalize the product term lines and the bit lines of the PLA, such division may be made so long as the sum of the numbers of the adjacent product term lines in the horizontal direction and the sum of the numbers of the adjacent bit lines in the vertical direction are less than prescribed values thus alleviating the limits on the number of product term lines and the number of the bit lines of the PLA. With this arrangement and the method of constructing of this invention, the function of each cell unit would not be specified so that versatile design can be made. For this reason, when the cell units of the PLA are divided as shown by solid lines in FIG. 4 it is possible to change the layout as shown by dotted lines in FIG. 4. Such versatility enables use of chips of small areas for realizing the same logic.

Figure 5:
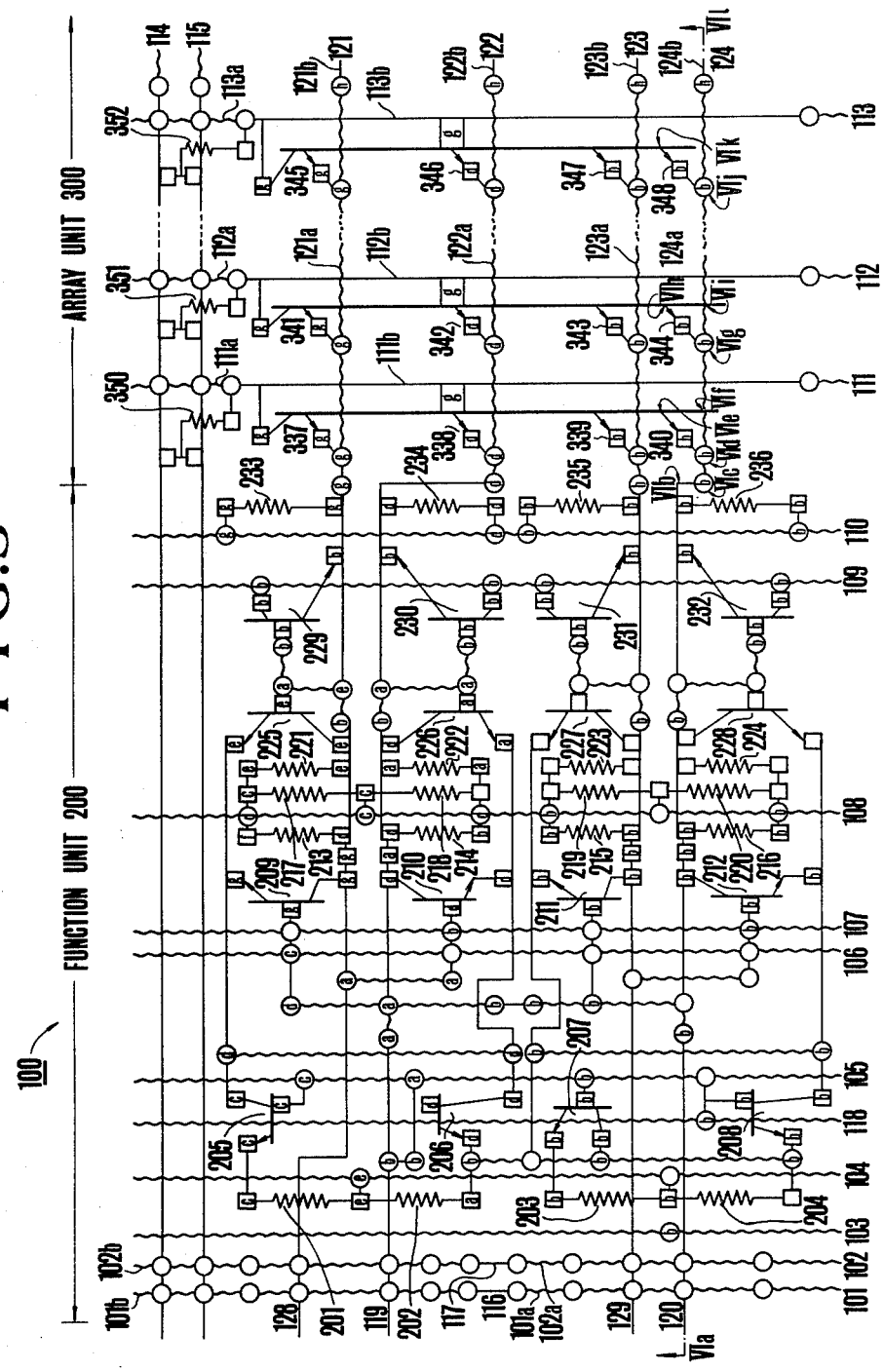
FIG. 5 is a connection diagram of showing one example of a PLA to which the invention is applied.

FIG. 5 shows the detail of one example of the PLA of this invention comprising a single cell unit 100 made up of a function unit 200 and an array unit 300. In this embodiment the function unit 200 comprises resistors 201 through 204, NPN bipolar transistors 205 through 212 and 225 through 232 and resistors 213 through 224 and 233 through 236, whereas the array unit 300 comprises NPN transistors 337 through 348 and resistors 350 through 352. These electronic circuit elements are formed on a single semiconductor substrate which may be, for example, a silicon wafer, or a silicon substrate formed on a germanium, gallium, sapphire or other insulators. In FIG. 5, there are also shown wiring lines 101 through 129 for interconnecting the electronic elements of the function unit 200 and the array unit 300. Of these wiring lines straight lines show first metal layer wiring of multilayer construction while wavy lines the second metal layer wiring small circles show the position of through holes and squares the positions of the contact holes. The through holes or contact holes are formed at these positions depending upon the functions of the logic circuits to be formed.

The functions of respective wiring lines are as follows. Wiring lines 101 and 102 are signal lines utilized as the wirings between multistage PLSAs, as the wirings to bonding pads or as the wiring for feedback. As shown in FIG. 5, these signal lines are formed on the second metal layer except portions 116 and 117 which are formed on the first metal layer. Each wiring line described above is connected or disconnected whether through holes are provided or not for the switches located between the portions 116 and 117 and wiring lines 101a, 101b, 102a and 102b on both sides thereof.

Line 103 acts as a $-V_{EE2}$ line connected to a source of voltage having a voltage of $-V_{EE2}$, lines 104 and 110 act as $-V_{EE}$ lines connected to a source of voltage having a voltage of $-V_{EE}$, line 105 acts as a $V_{cs}$ line connected to a source of voltage having a voltage of $V_{cs}$, lines 118 and 106 act as $V_{ref2}$ line connected to a source of voltage having a voltage of $V_{ref2}$, line 107 acts as a $V_{ref2}$ line connected to a source of voltage having a voltage of $V_{ref2}$, and lines 108 and 109 are grounded lines.

Lines 111, 112 and 113 are product term or column lines utilized to pass product signals of the AND array. When not utilized as the product term lines they can be used as connecting lines between the PLAs of a multistage PLA. Most of these product term lines comprise the first layer wires except protions 111a, 112a and 113a which are constructed as the second layer wires. Accordingly, it is possible to connect to and disconnect from the product term lines of other cell unit depending upon whether through holes are provided or not for the switches interposed between the opposed ends of the portions 111a, 112a and 113a and of the remaining portions 111b, 112b and 113b.

Where the cell unit is used as the AND array of the uppermost stage of the PLA like the cell unit 11a shown in FIG. 2, the lines 114 and 115 can be used as the grounded conductors but as signal lines in other cases.

Lines 121 through 124 which constitute a matrix together with the product term lines 111, 112 and 113 act as bit lines which are also formed on the second metal layer and when through holes are provided for switches interposed between the second layer portions 121a, 122a, 123a and 124a and the first layer portions 121b, 122b, 123b and 124b it is possible to integrally form the bit lines 121a through 124a with corresponding bit lines of a cell unit disposed on the back of the cell unit 110.

Resistors 350 through 352 are connected in the uppermost stage of an AND array of one PLA, and in the illustrated embodiment, one ends of these resistors are connected to the product term lines 111, 112 and 113 respectively.

Lines 119, 120, 128 and 129 constitute input or output terminals of the cell unit 100.

FIG. 6 is a longitudinal sectional view of a PLA taken along a line VIa–VIb . . . VII and not provided with any through hole and contact hole. In FIG. 6 reference numeral 400 designates a P type semiconductor substrate, 401 the first layer wiring line, 402 the second layer wiring line, and 403 and 404 insulators. Table 1 below shows the ON and OFF conditions of the through holes and the contact holes comprising respective switches when the cell unit 100 shown in FIG. 5 is used to fabricate various logic circuits.

Table I

| No. | Combined Arrangement | ON . OFF Conditions of Switches | | | | | | |
|---|---|---|---|---|---|---|---|---|
| | | a | b | c | d | e | f | g |
| A | two bit decoder and AND array | | 0 | | 0 | | 0 | 0 |
| B | output buffer and OR array | | | 0 | | 0 | 0 | 0 |
| C | RS flip-flop circuit and OR array | 0 | | | 0 | 0 | | 0 |

Figure 7:
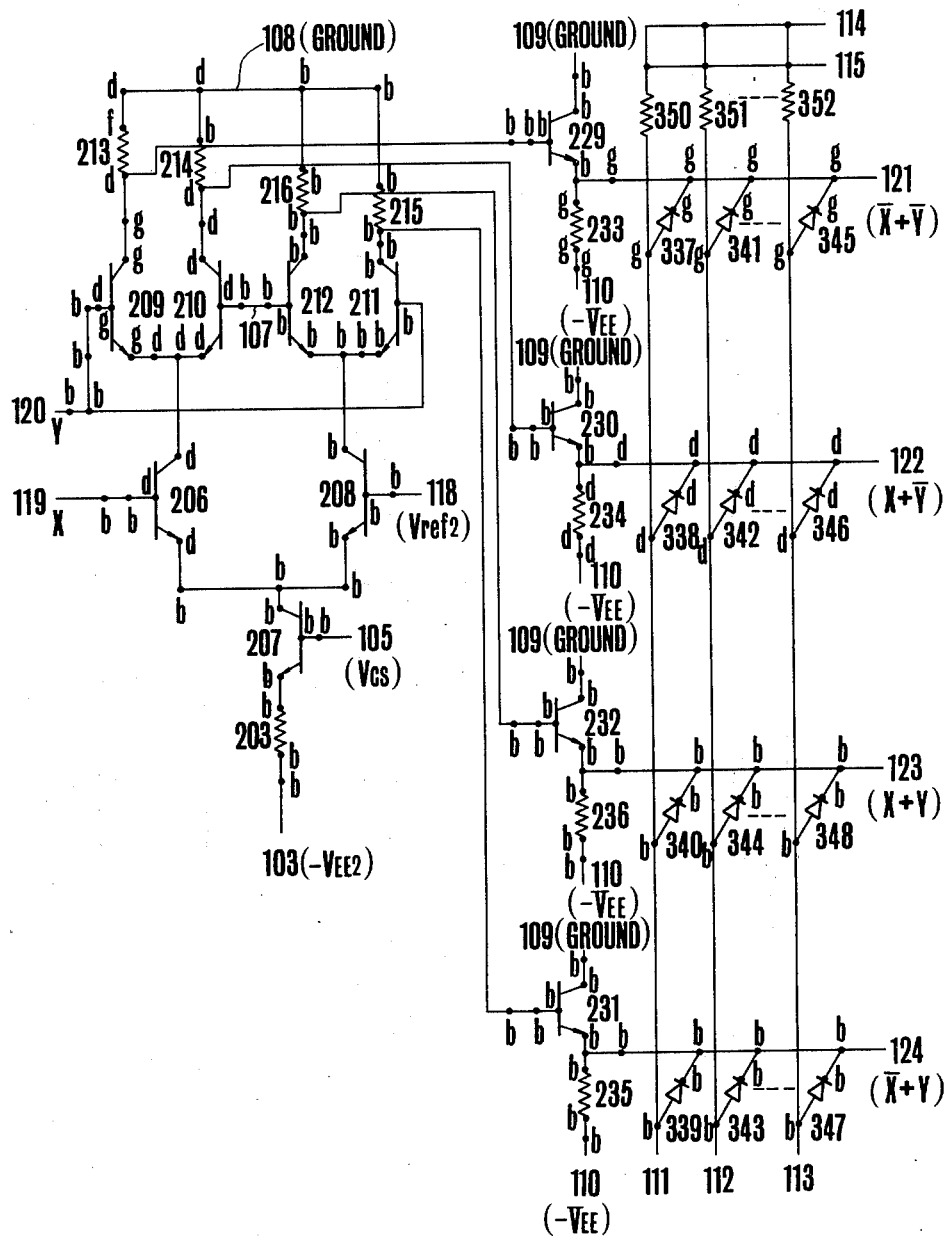
FIG. 7 is a connection diagram showing a circuit utilizing the PLA shown in FIG. 5 and in which a two bit decoder circuit and an array circuit are combined according to Table 1.

Remarks:
0 mark . . . . . . . . On state of the switch
no mark . . . . . . . . OFF state of the switch Where a combination of a two bit decoder circuit and an AND array is to be formed, the first layer lines and the second layer lines are interconnected through holes b, d, f and g according to item A shown in Table 1. The circuit completed by this connection is shown in FIG. 7 in which reference numerals 119 and 120 show the input lines of a two bit decoder constituted by two stage cascade connected emitter coupled logic circuit (ECL).

Demoting the input signals applied to these lines by Y and X, corresponding signals $(\overline{X+Y})$, $(X+\overline{Y})$, $(\overline{X}+Y)$ and $(\overline{X}+Y)$ are produced respectively on lines 121, 122, 123 and 124. In this case, resistors 350, 351, and 352 are connected in only the uppermost stage of the AND array of a PLA. The actual sectional construction of the PLA shown in FIG. 6 is shown by FIG. 8.

Figure 9:
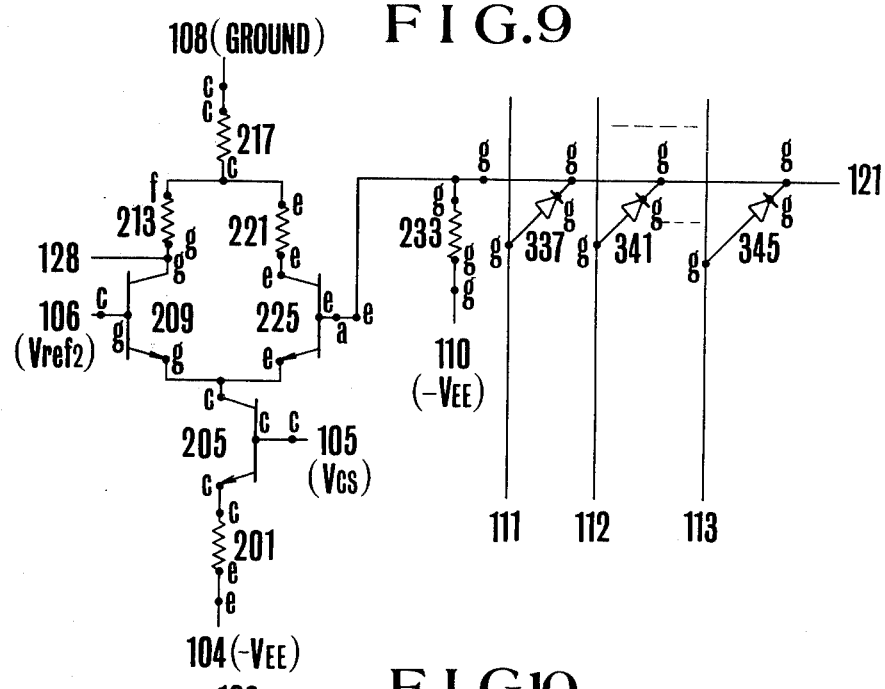
FIGS. 9 and 10 are connection diagrams showing a combination of an output buffer and an OR array, and a combination of a RS type flip-flop circuit and an OR array which are combined according to Table 1 and utilizing the PLA shown in FIG. 5.

The two bit decoder system utilized in this embodiment is more advantageous than a conventional one bit decoder system in that it requires smaller number of the product term lines. This tendency becomes more remarkable when an arithmetic logic such as an adder is contemplated and the number of the product term lines can be reduced to about 1/10 of the one bit decoder system in some cases.

Where a combination of an output buffer and an OR array is to be formed, the first metal layer and the second metal layer are interconnected through holes c, e, f and g according to item B of Table 1. FIG. 9 shows a circuit constructed by such connections and by utilizing ¼ of the cell units. In this case, the logical sum signal of the output signals on product term lines 111, 112 and 113 is produced on line 121 and this signal is applied to the base electrode of a transistor 225 and is then sent to an output terminal 128 through the collector electrode of transistor 209. When this combination of an output buffer and an OR array in applied to all cell units 100 shown in FIG. 5, four identical combinations are formed.

In this example, the output signal of the output buffer, that is the signal appearing on the output terminal 128 is at the level of $V_{ref2}$. However, where it is desired to produce an output at the level of $V_{ref1}$, the resistor 217 shown in FIG. 7 is removed and the $V_{ref2}$ line 106 connected to the base electrode of transistor 209 should be connected to $V_{ref1}$ line 107.

Figure 10:
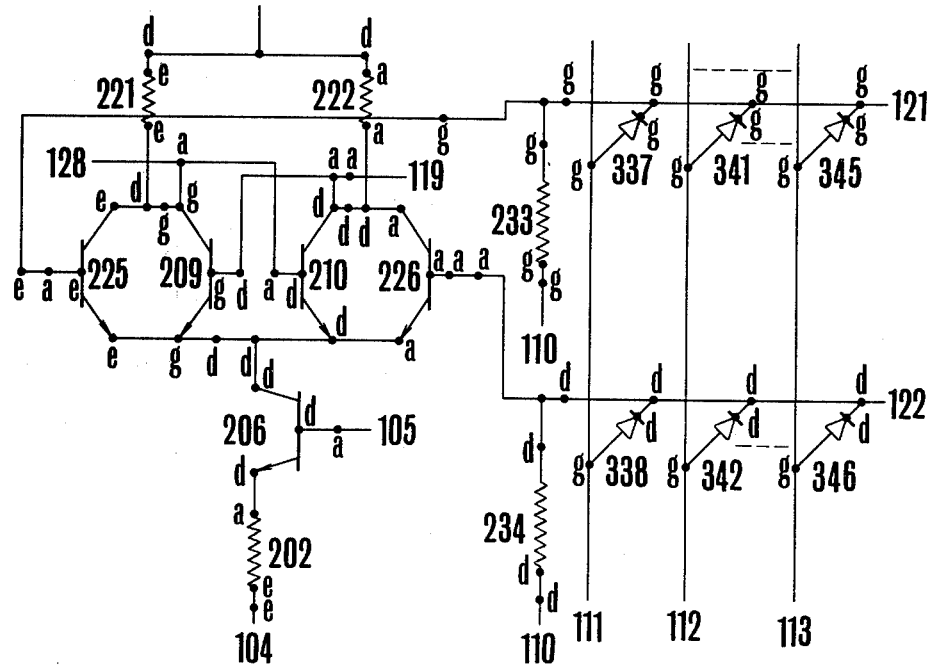

To form a combination of a RS type flip-flop circuit and an OR array, the first metal layer and the second metal layer of respective switches are interconnected through holes a, d, e and g according to item C of Table 1. The circuit formed by this connection is shown in FIG. 10. As can be noted from FIG. 10 this circuit is constructed by using ½ of the cell units shown in FIG. 5. The flip-flop circuit constructed in this manner is a simple RS type flip-flop circuit, but other types of flip-flop circuits such as a clock gated RS flip-flop circuit, a set preference flip-flop circuit, a D flip-flop circuit and a T flip-flop circuit can be realized by constructing the circuit such that the combination logic is computed by the AND array and the OR array and that the output thereof is applied to the input of the RS flip-flop circuit. FIGS. 11 through 17 show examples of the switching elements which connect and interrupt the metal layers. FIGS. 11A–11D show a case in which a first metal layer and a second metal layer are interconnected or interrupted by the presence or absence of through holes. FIGS. 11A and 11B show an interrupted state, while FIGS. 11C and 11D an interconnected state. In the state shown by FIGS. 11A and 11B a first metal layer 401 formed on the upper surface of a semiconductor substrate 400 via a dielectric layer 404, and a second metal layer formed on the first metal layer 401 through a dielectric layer 403 are separated by the dielectric layer 403 so that the first and second metal layers 401 and 402 are electrically interrupted. This means that a switch at this position is opened.

FIGS. 11C and 11D shows a state in which the first and second metal layers shown in FIGS. 11A and 11B are interconnected by providing a through hole 410 for the dielectric layer 403 interposed between these metal layers. This means that the switch at this position is closed. To interconnect or not the first and second metal layers is determined whether the through opening 410 is formed or not through the dielectric layer 403. Such through opening can be formed or not by changing a mask that determines the pattern of the dielectric layer 403.

FIGS. 12A through 12D show a modification of the switch shown in FIGS. 11A through 11D in which FIGS. 12A and 12B show an interrupted state and FIGS. 12B and 12C an interconnected state. In this case, in order to electrically isolate first and second metal layers 401 and 402, as shown in FIGS. 12A and 12B, the first metal layer 401 is formed on the first dielectric layer 404 such that it terminates a short distance from a through hole 411 of the second dielectric layer 403 on which the second metal layer 402 is formed subsequent to the formation of the first metal layer. With this construction, although the second metal layer 402 extends through the through hole 411 since the first metal layer 401 does not reach the through hole, the first and second metal layers are positively isolated. Thus, this switch is opened. Conversely, in the construction shown in FIGS. 12C and 12D, as the first metal layer 401 extends immediately beneath the through hole 412, the first and second metal layers 401 and 402 are electrically interconnected. Consequently, this switch is closed. In the cases shown in FIGS. 12A–12D, the design of the mask pattern for forming the first metal layer 401 is changed depending upon whether the switch is closed or opened.

Figure 13A:
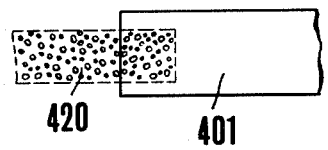
Figure 13B:
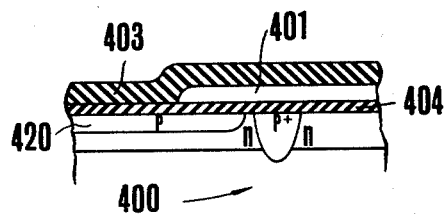
Figure 13C:
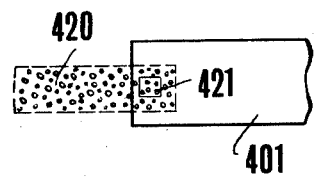
Figure 13D:
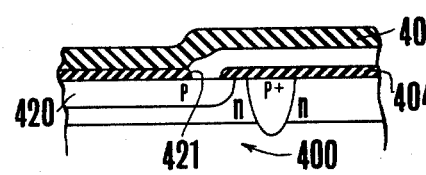

In the cases shown in FIGS. 13A–13D a diffusion layer 420 formed on the semiconductor substrate and the first metal layer 401 are interconnected or disconnected depending upon the presence or absence of a contact hole 421. FIGS. 13A and 13B show a case wherein metal layers 420 and 401 are disconnected whereas FIGS. 13C and 13D show a case wherein the metal layers 420 and 401 are interconnected. It should be understood that FIGS. 13A and 13C are shown with dielectric layer 403 removed. In the case shown in FIGS. 13A and 13B, a dielectric layer 404 is formed on the diffusion layer 420 on the semiconductor substrate 400 and the first metal layer 401 is formed on the dielectric layer 402. A second dielectric layer 403 is formed on the first metal layer 401. As a consequence, the diffusion layer 420 and the first metal layer 401 are electrically isolated, meaning that the switch at this position is opened. On the other hand, FIGS. 13C and 13D show a case wherein the diffusion layer 420 and the first metal layer 401 are interconnected through contact hole 421 provided for the dielectric layer 404. This means that the switch formed at this position is closed. In this case, a mask pattern for forming the contact hole 421 through the dielectric layer 404 is changed depending upon whether the switch is to be closed or opened.

Figure 14A:
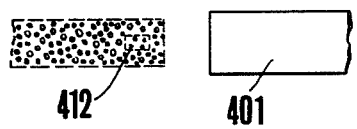
Figure 14B:
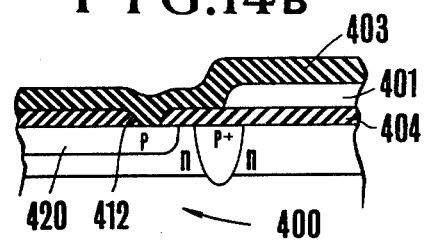
Figure 14C:
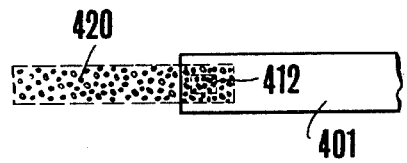
Figure 14D:
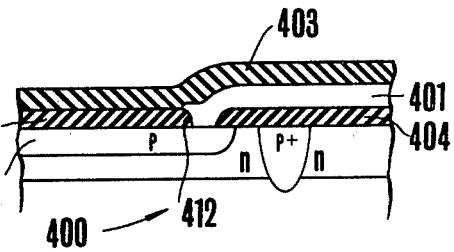

FIGS. 14A–14D show cases wherein a diffusion layer 420 formed on the semiconductor substrate 400 is connected to or disconnected from the first metal layer 401 depending upon the presence or absence of a contact hole 412. FIGS. 14A and 14B show an interconnected state, while FIGS. 14C and 14D show a disconnected state. FIGS. 14A and 14C are shown with the dielectric layer 403 removed. Different from the cases shown in FIGS. 13A–13D, in which the diffusion layer 420 and the metal layer 401 are interconnected or disconnected depending upon the presence or absence of the contact hole, in the cases shown in FIGS. 14A–14D a contact hole 412 is formed through a dielectric layer 404 formed on a diffusion layer 420, and where it is necessary to disconnect the diffusion layer 420 from the first metal layer 401 this layer is terminated short of the contact hole 412. Then the dielectric layer 403 overlying the first metal layer 401 fills the contact hole 412 thus preventing other metal layer from reaching the diffusion layer 420 through the contact hole 412. On the contrary, in the case shown in FIGS. 14C and 14D, the first metal layer 401 is formed to reach the contact hole 412 thereby connecting the first metal layer 401 to the diffusion layer 420 through the contact hole 412. Accordingly, in the cases shown in FIGS. 14A–14D, the mask pattern for forming the first metal layer 401 is changed depending upon whether the switch is to be closed or opened.

In the foregoing embodiments switches are closed or opened by means of contact holes and through holes but other well known switching elements can also be used. FIGS. 15, 16 and 17 illustrate examples of such other switching elements.

FIGS. 15A, 15B and 15C show diode switches. In the case of FIG. 15A, two diodes 440 and 441 connected in series opposition are formed at programmed positions corresponding to the contact holes and the through holes described above. With this arrangement, terminals A and B are electrically isolated. When an overvoltage which make terminal A to be negative and terminal B to be positive, lefthand diode 440 would be ruptured thus forming a short circuit condition. Consequently, an electric path which is conductive for the current flowing from terminal A to terminal B but not conductive for the current flowing in the opposite direction, as shown in FIG. 15B. Conversely, when an overvoltage of the opposite polarity is impressed across terminals A and B there is formed an electric path which is conductive for the current flowing from terminal B to terminal A but not conductive for the current flowing in the opposite direction, as shown in FIG. 15C. When the diode switch described above is used it is not necessary to change the design of the mask pattern. Accordingly, it is possible to design the circuit after completion of the arrangement.

FIG. 16 shows another example, wherein a fuse 450 is provided at a predetermined programmed position. In this case, the circuit between terminals A and B is normally conductive but will be interrupted when the fuse 450 is blown out. Again, it is possible to design the circuit after completion of the arrangement.

FIGS. 17A and 18A show a case wherein a floating gate 460 comprising a FAMOS (floating gate avalanche injection MOS) is provided at a predetermined programmed position. Where electrons are not accumulated in the floating gate 460 as shown in FIG. 17A terminals A and B are isolated. Conversely, when a high voltage is impressed across terminals A and B electrons are accumulated in the floating gate 460 with the result that an inversion layer, or a channel 461 is formed at the interface of the semiconductor substrate 466 beneath the floating gate 460, thereby connecting terminal A with terminal B through a metal layer 462, diffusion layer 463, channel 461, diffusion layer 464, and metal layer 465. In FIGS. 17A and 17B, reference numerals 467 through 469 designate dielectric layers.

The arrangement of this invention has the following advantages.

(1) Since electronic circuit elements such as transistors and resistors of the function unit and the array unit which constitute a cell unit are connected to wiring lines through switches, instead of being connected to some extent to the wiring line for manifesting specific functions as in the prior art arrangement it is free to change the logical functions, thereby greatly improving the logic capabilities.

To more clearly demonstrate the advantages of this invention, the arrangement of this invention is compared with the prior art PLA. Let us consider package devices I and II having gates, flip-flop circuits (FF) input terminals and output terminals of the numbers as shown in Tables 2 and 3. To fabricate device II of the packages A-N and A-F, PLAs having sizes shown in the lowermost rows are necessary. These sizes show the maximum values required to fabricate package A-N. The data regarding the size of the PLAs of this invention are derived from the data wherein the sum of the number of the AND array bit lines and the number of the OR array bit lines of each package is a maximum whereas the data regarding the size of commercial PLAs are derived out from respective maximum values of the bit numbers of the AND array and the OR array.

Table 2

| | | | | | Device I | | | |
| --- | --- | --- | --- | --- | --- | --- | --- | --- |
| | | Package | | | PLA arrangement of this invention | | Commercial PLA | |
| Package Code | gate number | FF number | input terminal number | output terminal number | AND array bit line number | OR array bit line number | AND array bit line number | OR array bit line number |
| A | 111 | 13 | 60 | 21 | 73 | 38 | 87 | 38 |
| B | 97 | 8 | 47 | 16 | 50 | 26 | 60 | 26 |
| C | 127 | 9 | 45 | 38 | 59 | 24 | 59 | 26 |
| D | 199 | 26 | 34 | 66 | 63 | 44 | 101 | 44 |
| E | 195 | 24 | 32 | 50 | 68 | 61 | 141 | 61 |
| F | 211 | 0 | 43 | 37 | 56 | 36 | 83 | 36 |
| G | 133 | 0 | 58 | 26 | 65 | 26 | 65 | 28 |
| H | 159 | 16 | 45 | 32 | 55 | 36 | 83 | 36 |
| I | 156 | 19 | 37 | 29 | 62 | 30 | 69 | 30 |
| J | 249 | 30 | 15 | 15 | 45 | 19 | 45 | 20 |
| K | 154 | 11 | 44 | 37 | 62 | 42 | 97 | 42 |
| L | 223 | 27 | 52 | 33 | 91 | 43 | 99 | 43 |
| M | 136 | 11 | 49 | 33 | 43 | 23 | 53 | 23 |
| N | 165 | 2 | 47 | 27 | 54 | 22 | 54 | 23 |
| Necessary Size (pieces) | 249 | 30 | 60 | 50 | 91 | 43 | 141 | 61 |

Table 2-continued

| | | Device I | | | | | | |
|---|---|---|---|---|---|---|---|---|
| | Package | | | | PLA arrangement of this invention | | Commercial PLA | |
| Package Code | gate number | FF number | input terminal number | output terminal number | AND array bit line number | OR array bit line number | AND array bit line number | OR array bit line number |
| A | 170 | 0 | 8 | 8 | 16 | 8 | 18 | 8 |
| B | 122 | 0 | 16 | 9 | 32 | 9 | 32 | 14 |
| C | 46 | 0 | 8 | 5 | 16 | 5 | 16 | 7 |
| D | 46 | 0 | 9 | 5 | 18 | 5 | 18 | 8 |
| E | 46 | 0 | 6 | 4 | 12 | 4 | 12 | 5 |
| F | 3 | 0 | 2 | 1 | 4 | 1 | 4 | 2 |
| Necessary Size (Pieces) | 170 | 0 | 16 | 9 | 32 | 9 | 32 | 14 |

From these data it can be noted that in order to fabricate device I by the prior art PLA technique it is necessary to use 61 OR array bit lines and 141 AND array bit lines (total 202). However, when device I is designed according to this invention the total number of bit lines is only 134.

To fabricate device II by the prior art technique it is necessary to use 32 AND array bit lines and 14 OR array bit lines (total 46) whereas when the device is designed in accordance with this invention, the total number of the bit lines is 41.

These data show that the programmable logic array arrangement can increase it logic capability by 10 to fifty percent than the prior art arrangement.

Considering a case in which a plurality of PLAs are fabricated on the same semiconductor substrate and supposing now that each package A-N of device I contains one PLA, the prior art PLA technique requires 1974 AND array bit lines and 854 OR array bit lines (total 2828) whereas the novel arrangement of this invention requires only 846 AND array bit lines and 470 OR array bit lines (total 1316).

With reference to device II, in a case wherein each PLA contains four A and each one of B, C, D, E and F, the prior art PLA technique requires 188 AND array bit lines and 81 OR array bit lines (total 369) whereas the arrangement of this invention requires only 146 AND array bit lines and 56 OR array bit lines (total 202).

As can be noted from the foregoing description, in a case wherein a plurality of PLAs are fabricated on the same semiconductor substrate it is also possible to increase the logical capability by 180 to 210 percent than the prior art arrangement.

(2) Furthermore, it is possible to use various well known methods of increasing the capabilities of PLA, for example a two decoder system, multistage PLA system, division of the product lines and the bit lines. For this reason, according to this invention it is possible to obtain PLAs having higher capabilities than the prior art PLAs having the maximum capabilities realized by using various methods of increasing the capability of PLAs.

(3) Actually, however, according to this invention, it is necessary to individually design various metal layer masks as well as wiring masks for preparing function units and array units. However, the latter mask comprises only few types of definite patterns and since the mask patterns can be processed with a computer, no hand work is necessary for their design. Accordingly, it is possible to manufacture larger scale logic integrated circuit at low cost and simple design.

It should be understood that the invention is not limited to the specific embodiments described above. Thus, for example, although the invention has been described in terms of optical exposure method utilizing mask patterns, electron beam exposure method can also be used in which case the mask pattern is replaced by electron beam exposure pattern.

What is claimed is:

1. A programmable logic array arrangement, comprising:
   a wiring matrix including a plurality of row lines and a plurality of column lines, the row and column lines being arranged in a matrix and including at least two conductive layers; and
   a plurality of cell units, each cell unit including;
      a function unit including;
         a first plurality of electronic elements; and
         a first plurality of switching elements for selectively connecting each of the first plurality of electronic elements to said row and column lines;
         said electronic elements and switching elements being arranged with respect to the wiring matrix so that both OR functions and AND functions may be implemented by each function unit by activating appropriate switching elements; and
      an array unit including:
         a second plurality of electronic elements; and
         a second plurality of switching elements for selectively connecting said second plurality of electronic elements to said row and column lines;
         said second plurality of electronic elements and said second plurality of switching elements being arranged so that a plurality of different logic functions can be implemented in an array unit by activating the appropriate ones of said second plurality of switching elements.

2. The programmable logic array arrangement of claim 1 further including a group of switching elements electrically located between said cell units for interconnecting selected ones of said row lines with selected ones of said column lines to interconnect said cell units.

3. The programmable logic array arrangement according to claim 2 wherein each of the group of switching elements includes one member which is formed by a part of a first one of said conductive layers and a second member which is formed by a part of the second one of said two conductive layers;

and wherein in an open switching element the first and second members of that switching element do not oppose one another.

4. The programmable logic array arrangement of claim 3 wherein the plurality of logic functions further includes a decoder function and an output buffer function.

5. The programmable logic array arrangement according to claim 2 wherein said first and second pluralities of switching elements are selectively closed depending upon whether the row and column lines of said wiring matrix are to be electrically connected to said electronic elements.

6. The programmable logic array arrangement according to claim 5 wherein each switching element comprises a pair of diodes connected in series opposition and wherein an over voltage of one polarity is impressed across said serially connected diodes to render said switching element closed whereas an over voltage of the opposite polarity is impressed to rupture either one of said diodes thus rendering conductive the same.

7. The programmable logic array arrangement according to claim 5 wherein each switching element comprises a fusible element which when blown off by the passage of an overcurrent opens said switching element.

8. The programmable logic array arrangement according to claim 5 wherein each switching element comprises a floating gate avalanche junction field effect transistor and wherein electrons are accumulated in the floating gate for closing said switching element.

9. The programmable logic array arrangement according to claim 1 wherein the wiring matrix comprises two metal layers, some of the switching elements selectively interconnect said two metal layers and the other switching elements selectively interconnect a diffusion layer of said semiconductor substrate and one of said metal layers.

10. The programmable logic array arrangement according to claim 9 wherein the connection between first and second metal layers and the connection between said diffusion layer and said first metal layer are provided by a through hole and a contact hole provided for a dielectric layer interposed therebetween.

11. The programmable logic array arrangement according to claim 1 wherein said electronic elements further comprises a diode.

12. The programmable logic array arrangement according to claim 13 wherein said function unit comprises a flip-flop circuit and a decoder, and said array unit comprises an AND array and an OR array.

13. The programmable logic array arrangement of claim 1 wherein the plurality of logic functions includes a flip flop function.

14. The programmable logic array arrangement of claim 1 wherein the wiring matrix further includes a third plurality of switching elements, electrically located between said cell units for selectively interconnecting said cell units.

* * * * *

UNITED STATES PATENT AND TRADEMARK OFFICE
CERTIFICATE OF CORRECTION

PATENT NO. : 4207556
DATED : June 10, 1980
INVENTOR(S) : Yoshi Sugiyama, et al.

It is certified that error appears in the above-identified patent and that said Letters Patent are hereby corrected as shown below:

Col. 1, line 34, change "Mcgrow" to -- McGraw -- ;
Col. 2, line 60, change "VI1" to -- VI$\ell$ -- ;
Col. 5, line 11, change "Algough" to -- Although -- ;
Col. 5, line 53, change "PLSAs" to -- PLAs --;
Col. 6, line 9, change "protions" to -- portions -- ;
Col. 6, line 39, change "VI1" to -- VI$\ell$ -- ;
Col. 7, line 27, change "in" to -- is -- ;
Col. 11, top of table, change "Table 2-continued, Device I" to -- Table 3, Device II -- ;
Col. 11, line 29, change "it" to -- its -- ;

Signed and Sealed this

Fourteenth Day of October 1980

[SEAL]

Attest:

SIDNEY A. DIAMOND

Attesting Officer

Commissioner of Patents and Trademarks